(12) United States Patent
Fan (10) Patent No.: US 11,481,072 B2
(45) Date of Patent: Oct. 25, 2022

(54) CAPACITANCE DETECTION CIRCUIT, TOUCH DETECTION APPARATUS AND ELECTRONIC DEVICE

(71) Applicant: SHENZHEN GOODIX TECHNOLOGY CO., LTD., Shenzhen (CN)

(72) Inventor: Shuo Fan, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 163 days.

(21) Appl. No.: 17/019,573

(22) Filed: Sep. 14, 2020

(65) Prior Publication Data

US 2021/0034179 A1 Feb. 4, 2021

Related U.S. Application Data

(63) Continuation of application No. PCT/CN2019/098922, filed on Aug. 1, 2019.

(51) Int. Cl.
*G06F 3/044* (2006.01)
*G01D 5/24* (2006.01)
*G06F 3/041* (2006.01)
*G01R 35/00* (2006.01)
*G01R 27/26* (2006.01)

(52) U.S. Cl.
CPC .......... *G06F 3/044* (2013.01); *G01D 5/24* (2013.01); *G01R 27/2605* (2013.01); *G01R 35/005* (2013.01); *G06F 3/04166* (2019.05)

(58) Field of Classification Search
CPC ... G01R 35/005; G01R 27/2605; G06F 3/044; G06F 3/0416; G06F 3/04166; H03K 17/962; H03K 2217/96071; H03K 2217/960705; G01D 5/24
See application file for complete search history.

(56) References Cited

U.S. PATENT DOCUMENTS

| | | |
|---|---|---|
| 8,547,118 B1 | 10/2013 | Vojjala et al. |
| 9,116,575 B2 | 8/2015 | Kao |
| 9,542,588 B2 | 1/2017 | Kremin et al. |
| 9,864,894 B2 | 1/2018 | Kremin et al. |
| 10,067,590 B2 | 9/2018 | Reynolds |

(Continued)

FOREIGN PATENT DOCUMENTS

| | | |
|---|---|---|
| CN | 102539049 A | 7/2012 |
| CN | 103324366 A | 9/2013 |

(Continued)

*Primary Examiner* — Yaron Cohen (57) ABSTRACT

Provided is a capacitance detection circuit, which has better detection performance. The capacitance detection circuit includes: a first charging and discharging circuit configured to perform charging or discharging on a capacitor to be detected; a second charging and discharging circuit configured to perform charging or discharging on a calibration capacitor; an analog-to-digital conversion circuit configured to continuously sample a voltage difference between the capacitor to be detected and the calibration capacitor in a charging or discharging process to obtain sampled data; and a digital processing circuit configured to detect a capacitance of the capacitor to be detected according to the sampled data.

19 Claims, 4 Drawing Sheets

(56) References Cited

U.S. PATENT DOCUMENTS

| | | |
|---|---|---|
| 10,073,560 B2 | 9/2018 | Reynolds et al. |
| 10,146,985 B2 | 12/2018 | Chung et al. |
| 10,268,867 B2 | 4/2019 | Kremin et al. |
| 10,352,731 B2 | 7/2019 | Tanaka et al. |
| 2009/0273739 A1* | 11/2009 | Brown ............... G09G 3/3648 349/72 |
| 2011/0157067 A1 | 6/2011 | Wagner et al. |
| 2014/0333575 A1 | 11/2014 | Hu |
| 2014/0362037 A1 | 12/2014 | Kao |
| 2015/0168529 A1* | 6/2015 | Regier ............... G01R 35/005 324/601 |
| 2016/0140376 A1 | 5/2016 | Kremin et al. |
| 2017/0090609 A1 | 3/2017 | Petrovic et al. |
| 2017/0177920 A1 | 6/2017 | Kremin et al. |
| 2017/0315650 A1 | 11/2017 | Reynolds |
| 2017/0315662 A1 | 11/2017 | Reynolds et al. |
| 2017/0343386 A1 | 11/2017 | Tanaka et al. |
| 2018/0039809 A1 | 2/2018 | Chung et al. |
| 2018/0260600 A1 | 9/2018 | Kremin et al. |
| 2018/0329538 A1 | 11/2018 | Hu |
| 2019/0278401 A1 | 9/2019 | Wang et al. |

FOREIGN PATENT DOCUMENTS

| | | |
|---|---|---|
| CN | 103376965 A | 10/2013 |
| CN | 103376967 A | 10/2013 |
| CN | 106020548 A | 10/2016 |
| CN | 107251043 A | 10/2017 |
| CN | 107450763 A | 12/2017 |
| CN | 107679444 A | 2/2018 |
| CN | 109144335 A | 1/2019 |
| CN | 208506138 U | 2/2019 |
| CN | 109496273 A | 3/2019 |
| JP | H095190 A | 1/1997 |
| SU | 1567999 A1 | 5/1990 |
| TW | 483169 B | 4/2002 |
| TW | 201447709 A | 12/2014 |
| WO | 2017190052 A1 | 11/2017 |

\* cited by examiner

Touch detection apparatus 800

Capacitance detection circuit 100

FIG. 8

Electronic device 900

Touch detection apparatus 800

FIG. 9

CAPACITANCE DETECTION CIRCUIT, TOUCH DETECTION APPARATUS AND ELECTRONIC DEVICE

CROSS-REFERENCE TO RELATED APPLICATIONS

This application is a continuation of International Application No. PCT/CN2019/098922, filed on Aug. 1, 2019, the disclosure of which is hereby incorporated by reference in its entirety.

TECHNICAL FIELD

The present application relates to the field of integrated circuits, in particular, to a capacitance detection circuit, a touch detection apparatus and an electronic device.

BACKGROUND

Capacitive sensors are widely used in the field of human-machine interaction of electronic products. Specifically, a capacitor is formed between a detection electrode and ground, when a conductor (such as a finger) approaches or touches the detection electrode, a capacitance between the detection electrode and the ground changes. By detecting a variation of the capacitance, information that the conductor approaches or touches the detection electrode is acquired, so as to determine user operation. The performance of a capacitance detection circuit has a direct impact on user operation experience, and therefore, it is urgent to solve a problem of how to improve detection performance of the capacitance detection circuit.

SUMMARY

Embodiments of the present application provide a capacitance detection circuit, a touch detection apparatus and an electronic device, and the capacitance detection circuit has better detection performance.

According to a first aspect, provided is a capacitance detection circuit, including: a first charging and discharging circuit, configured to perform charging or discharging on a capacitor to be detected; a second charging and discharging circuit, configured to perform charging or discharging on a calibration capacitor; an analog-to-digital conversion circuit, configured to continuously sample a voltage difference between the capacitor to be detected and the calibration capacitor in a charging or discharging process to obtain sampled data; and a digital processing circuit, configured to detect a capacitance of the capacitor to be detected according to the sampled data.

In one possible implementation manner, the digital processing circuit is configured to detect the capacitance of the capacitor to be detected according to an energy value of a fundamental frequency of the sampled data.

In one possible implementation manner, the digital processing circuit includes a digital demodulator, where the digital demodulator is configured to perform digital quadrature demodulation or Fourier transform on the sampled data to obtain the energy value of the fundamental frequency.

In one possible implementation manner, each charging and discharging period includes a charging phase and a discharging phase; in the charging phase, the first charging and discharging circuit and the second charging and discharging circuit are respectively configured to simultaneously charge the capacitor to be detected and the calibration capacitor; and in the discharging phase, the capacitor to be detected and the calibration capacitor are discharged simultaneously.

In one possible implementation manner, the first charging and discharging circuit includes a first current source configured to perform charging or discharging on the capacitor to be detected; and the second charging and discharging circuit includes a second current source configured to perform charging or discharging on the calibration capacitor.

In one possible implementation manner, a first end of the first current source is connected to a power supply, a second end of the first current source is connected to a first end of the capacitor to be detected through a first switch, the first end of the capacitor to be detected is also grounded through a second switch, and a second end of the capacitor to be detected is grounded; and a first end of the second current source is connected to the power supply, a second end of the second current source is connected to a first end of the calibration capacitor through a third switch, the first end of the calibration capacitor is also grounded through a fourth switch, and a second end of the calibration capacitor is grounded.

In one possible implementation manner, a first end of the first current source is grounded, a second end of the first current source is connected to a first end of the capacitor to be detected through a first switch, the first end of the capacitor to be detected is also connected to a power supply through a second switch, and a second end of the capacitor to be detected is connected to the power supply; and a first end of the second current source is grounded, and a second end of the second current source is connected to a first end of the calibration capacitor through a third switch, the first end of the calibration capacitor is also connected to the power supply through a fourth switch, and a second end of the calibration capacitor is connected to the power supply.

In one possible implementation manner, $C_C$ is equal to $C_0 \times I_2/I_1$, or a difference value between $C_C$ and $C_0 \times I_2/I_1$ is less than a preset value, where $C_0$ is a base capacitance of the capacitor to be detected, $C_C$ is a capacitance of the calibration capacitor, $I_1$ is a current value of the first current source, and $I_2$ is a current value of the second current source.

In one possible implementation manner, the first charging and discharging circuit includes a first resistor configured to perform charging or discharging on the capacitor to be detected; and the second charging and discharging circuit includes a second resistor configured to perform charging or discharging on the calibration capacitor.

In one possible implementation manner, a first end of the first resistor is connected to a power supply, a second end of the first resistor is connected to a first end of the capacitor to be detected through the first switch, the first end of the capacitor to be detected is also grounded through the second switch, and a second end of the capacitor to be detected is connected to the power supply; and a first end of the second resistor is connected to the power supply, a second end of the second resistor is connected to a first end of the calibration capacitor through the third switch, the first end of the calibration capacitor is also grounded through the fourth switch, and a second end of the calibration capacitor is connected to the power supply.

In one possible implementation manner, a first end of the first resistor is grounded, a second end of the first resistor is connected to a first end of the capacitor to be detected through a first switch, the first end of the capacitor to be detected is also connected to a power supply through a second switch, and a second end of the capacitor to be detected is grounded; and a first end of the second resistor is grounded, and a second end of the second resistor is connected to a first end of the calibration capacitor through a third switch, the first end of the calibration capacitor is also connected to the power supply through a fourth switch, and a second end of the calibration capacitor is grounded.

In one possible implementation manner, the first charging and discharging circuit includes a first transistor configured to perform charging or discharging on the capacitor to be detected; and the second charging and discharging circuit includes a second transistor configured to perform charging or discharging on the calibration capacitor.

In one possible implementation manner, the first transistor and the second transistor are P-type metal-oxide semiconductor (MOS) transistors, a gate of the first transistor is connected to a fixed level, a source of the first transistor is connected to a power supply, a drain of the first transistor is connected to a first end of the capacitor to be detected through a first switch, the first end of the capacitor to be detected is also grounded through a second switch, and a second end of the capacitor to be detected is grounded; and a gate of the second transistor is connected to a fixed level, a source of the second transistor is connected to the power supply, a drain of the second transistor is connected to a first end of the calibration capacitor through a third switch, the first end of the calibration capacitor is also grounded through a fourth switch, and a second end of the calibration capacitor is grounded.

In one possible implementation manner, the first transistor and the second transistor are N-type MOS transistors, a gate of the first transistor is connected to a fixed level, a source of the first transistor is grounded, a drain of the first transistor is connected to a first end of the capacitor to be detected through a first switch, the first end of the capacitor to be detected is connected to a power supply through a second switch, and a second end of the capacitor to be detected is connected to the power supply; and a gate of the second transistor is connected to a fixed level, a source of the second transistor is grounded, a drain of the second transistor is connected to a first end of the calibration capacitor through a third switch, the first end of the calibration capacitor is also connected to the power supply through a fourth switch, and a second end of the calibration capacitor is connected to the power supply.

In one possible implementation manner, the capacitance detection circuit further includes a control circuit, configured to in the charging phase, control the first switch and the third switch to be turned on, and control the second switch and the fourth switch to be turned off; in the discharging phase, control the second switch and the fourth switch to be turned on, and control the first switch and the third switch to be turned off.

In one possible implementation manner, $T_C=2^M \times T_S$, where $T_C$ is a length of N charging and discharging period(s), $2^M$ is the number of sampled points in the N charging and discharging period(s), $T_S$ is a time interval between two adjacent sampled points, and M and N are positive integers.

In one possible implementation manner, the fundamental frequency is $1/T_C$.

In one possible implementation manner, the capacitance detection circuit further includes an operational amplifier, where two input ends of the operational amplifier are respectively connected to the capacitor to be detected and the calibration capacitor.

In one possible implementation manner, the operational amplifier is a continuous instrumentation operational amplifier.

In one possible implementation manner, the capacitance detection circuit further includes a filter, where an input end of the filter is connected to an output end of the operational amplifier, and an output end of the filter is connected to an input end of the analog-to-digital conversion circuit.

In one possible implementation manner, the capacitor to be detected is a capacitive sensor disposed on a touch control panel, and the capacitive sensor is configured to detect touch information of a finger on the touch control panel.

In one possible implementation manner, when the energy value of the fundamental frequency is less than a threshold value, it indicates that no finger touches the capacitive sensor; and when the energy value of the fundamental frequency is greater than the threshold value, it indicates that a finger touches the capacitive sensor.

According to a second aspect, an embodiment of the present application provides a touch detection apparatus, including the capacitance detection circuit in the first aspect or any one of possible implementation manners of the first aspect.

According to a third aspect, an embodiment of the present application provides an electronic device, including the touch detection apparatus according to the second aspect.

Based on the foregoing technical solution, an analog-to-digital conversion circuit may continuously sample a voltage difference between a capacitor to be detected and a calibration capacitor in a charging or discharging process, to obtain a change situation of the voltage difference in the charging or discharging process; and a digital processing circuit may detect a capacitance variation of the capacitor to be detected by processing the continuously sampled data. Since the sampled data is obtained by continuously sampling the voltage difference, the sampled data is associated with the voltage difference, so that the capacitance of the capacitor to be detected may be detected according to the sampled data. Because the capacitance variation of the capacitor to be detected is detected in a digital domain and an interference signal and a useful signal have different frequencies, noise interference could be reduced and a signal-to-noise ratio of the capacitance detection circuit could be improved.

DESCRIPTION OF EMBODIMENTS

Embodiments of the present application will be described hereinafter in conjunction with the drawings in the embodiments of the present application.

A capacitive sensor is widely used in a plurality of electronic systems, and is usually used as an input device of a system to provide input information, such as position, motion, force and duration. Generally, a user operates such as approaching, touching, pressing or sliding, one or more sensing areas of a capacitive sensor, to generate a capacitive effect with the sensing areas, and a user operation may be determined by quantifying the capacitive effect.

Figure 1:
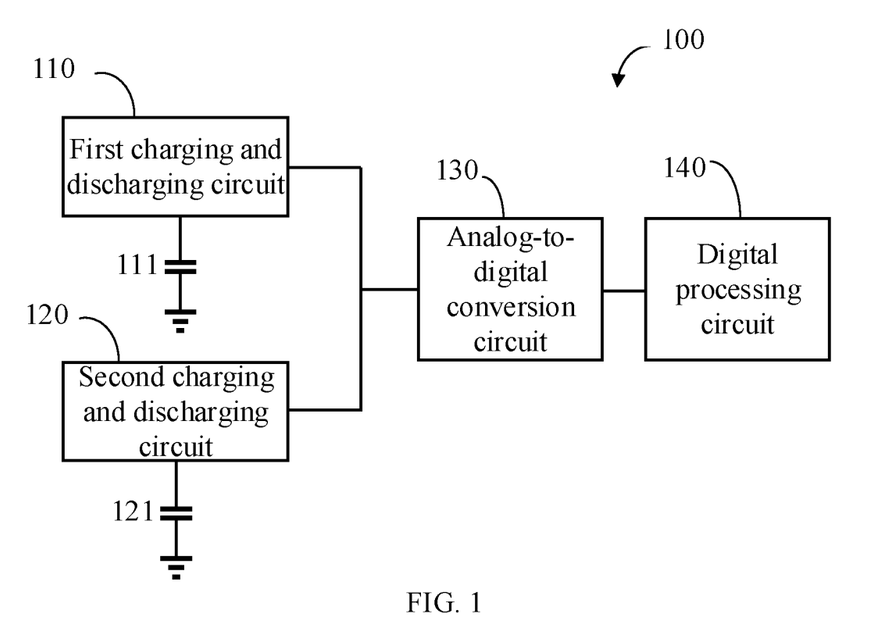
FIG. 1 is a schematic block diagram of a conventional capacitance detection circuit.

FIG. 1 is a schematic structural diagram of a capacitance detection circuit 100 according to an embodiment of the present application. As shown in FIG. 1, the capacitance detection circuit 100 is connected to a capacitor to be detected 111, and the capacitance detection circuit 100 includes:

a first charging and discharging circuit 110, configured to perform charging or discharging on the capacitor to be detected 111;

a second charging and discharging circuit 120, configured to perform charging or discharging on a calibration capacitor 121;

an analog-to-digital conversion circuit 130, configured to continuously sample a voltage difference between the capacitor to be detected 111 and the calibration capacitor 121 in a charging or discharging process to obtain sampled data; and a digital processing circuit 140, configured to detect a capacitance of the capacitor to be detected 111 according to the sampled data.

In this embodiment, the analog-to-digital conversion circuit 130 may continuously sample the voltage difference between the capacitor to be detected 111 and the calibration capacitor 121 in the charging or discharging process, to obtain a change situation of the voltage difference in the charging or discharging process; and the digital processing circuit 140 may detect a capacitance variation of the capacitor to be detected by processing the continuously sampled data. Since the sampled data is obtained by continuously sampling the voltage difference, an energy value of a fundamental frequency of the sampled data is associated with the voltage difference, so that the capacitance of the capacitor to be detected may be detected according to the energy value of the fundamental frequency. Because the capacitance variation of the capacitor to be detected is detected in a digital domain and an interference signal and a useful signal have different frequencies, noise interference could be reduced and a signal-to-noise ratio of the capacitance detection circuit could be improved.

The capacitance detection circuit 100 in this embodiment may be applied to, for example, a capacitive sensor, where the capacitor to be detected 111 is a sensing-capacitor of the capacitive sensor.

When there is no touch, a capacitance $C_X$ of the capacitor to be detected 111 is equal to a base capacitance $C_0$.

When there is a touch, a capacitance $C_X$ of the capacitor to be detected 111 is increased by $\Delta C$ to be $C_X=C_0+\Delta C$.

The calibration capacitor 121 may be, for example, a variable capacitor array or a fixed capacitor.

The first charging and discharging circuit 110 may include devices such as, a current source, a resistor, a transistor, or the like, configured to perform charging or discharging on the capacitor to be detected 111.

The second charging and discharging circuit 120 may include devices such as, a current source, a resistor, a transistor, or the like, configured to perform charging or discharging on the calibration capacitor 121.

In a process of performing charging or discharging on the capacitor to be detected 111 and the calibration capacitor 121, a voltage of the capacitor to be detected 111 and a voltage of the calibration capacitor 121 change according to a certain rule, and a voltage difference between the capacitor to be detected 111 and the calibration capacitor 121 also changes according to a certain rule. After the analog-to-digital conversion circuit 130 continuously samples the voltage difference that continuously changes in the charging or discharging process, the digital processing circuit 140 may obtain capacitance information of the capacitor to be detected 111 from the sampled data.

For example, the digital processing circuit is configured to detect the capacitance of the capacitor to be detected 111 according to the energy value of the fundamental frequency of the sampled data. The energy value of the fundamental frequency of the sampled data reflects a change situation of the voltage difference. The larger the energy value of the fundamental frequency is, it indicates that the larger the voltage difference is, and therefore the larger a capacitance variation of the capacitor to be detected 111 is. On the contrary, the smaller the energy value of the fundamental frequency is, it indicates that the smaller the voltage difference is, and therefore the smaller a capacitance variation of the capacitor to be detected 111 is.

The analog-to-digital conversion circuit 130 may sample a voltage difference between the capacitor to be detected 111 and the calibration capacitor 121 in N charging and discharging period(s) each time, where N is a positive integer. Optionally, each charging and discharging period includes a charging phase and a discharging phase.

In the charging phase, the first charging and discharging circuit 110 and the second charging and discharging circuit 120 are respectively configured to simultaneously charge the capacitor to be detected 111 and the calibration capacitor 121. In the discharging phase, the capacitor to be detected 111 and the calibration capacitor 121 are discharged simultaneously.

The N charging and discharging period(s) constitutes a driving period, and during the driving period, the analog-to-digital conversion circuit 130 continuously samples the voltage difference between the capacitor to be detected 111 and the calibration capacitor 121, and transmits sampled data to the digital processing circuit 140. Since a change rule of the voltage difference in each charging and discharging period is the same, in the N charging and discharging period(s) the voltage difference periodically changes. The digital processing circuit 140 demodulates the received sampled data that is periodically distributed and obtains the energy value of the fundamental frequency of the sampled data, thereby determining the capacitance of the capacitor to be detected 111 according to the energy value.

It should be understood that in the embodiment of the present application, a charging and discharging circuit charging a capacitor refers to a process in which charges are transferred to the capacitor to increase the quantity of charges stored in the capacitor, and a capacitor discharging refers to a process in which charges are transferred from the capacitor to reduce the quantity of charges stored in the capacitor.

The embodiment of the present application does not limit the implementation forms of the first charging and discharging circuit 110 and the second charging and discharging circuit 120. As an example, the present application provides the following three implementation manners.

Manner 1

The first charging and discharging circuit 110 includes a first current source 112, and the second charging and discharging circuit 120 includes a second current source 122.

Optionally, the first current source 112 is configured to charge the capacitor to be detected 111, and the second current source 122 is configured to charge the calibration capacitor 121.

For example, a first end of the first current source 112 is connected to a power supply $V_{DD}$, and a second end of the first current source 112 is connected to a first end of the capacitor to be detected 111 through a first switch S1, the first end of the capacitor to be detected 111 is also grounded through a second switch S2, and a second end of the capacitor to be detected 111 is grounded; and a first end of the second current source 122 is connected to the power supply $V_{DD}$, and a second end of the second current source 122 is connected to a first end of the calibration capacitor 121 through a third switch S3, the first end of the calibration capacitor 121 is also grounded through a fourth switch S4, and a second end of the calibration capacitor 121 is grounded.

For another example, a first end of the first current source 112 is grounded, and a second end of the first current source 112 is connected to a first end of the capacitor to be detected 111 through a first switch S1, the first end of the capacitor to be detected 111 is also connected to a power supply $V_{DD}$ through a second switch S2, and a second end of the capacitor to be detected 111 is connected to the power supply; and a first end of the second current source 122 is grounded, and a second end of the second current source 122 is connected to a first end of the calibration capacitor 121 through a third switch S3, the first end of the calibration capacitor 121 is also connected to the power supply $V_{DD}$ through a fourth switch S4, and a second end of the calibration capacitor 121 is connected to the power supply.

Optionally, it may be set that $C_C = C_0 \times I_2/I_1$, where $C_0$ is a base capacitance of the capacitor to be detected 111, $C_C$ is a capacitance of the calibration capacitor 121, $I_1$ is a current value of the first current source 112, and $I_2$ is a current value of the second current source 122.

At this time, the voltage difference between the capacitor to be detected 111 and the calibration capacitor 121 reflects a capacitance variation $\Delta C$ of the capacitor to be detected 111 relative to the base capacitance $C_0$, and is independent of $C_0$. Therefore, the base capacitance $C_0$ is cancelled in a voltage domain, so that the capacitance detection circuit 100 is no longer affected by the base capacitance $C_0$, and the detection sensitivity and accuracy of the capacitance detection circuit 100 are improved.

If the cancellation of the base capacitance $C_0$ is not considered, the capacitance of the calibration capacitor 121 may be reduced by setting $C_C < C_0 \times I_2/I_1$, thereby reducing a volume of the capacitance detection circuit 100 and the cost of a chip.

It should be understood that when the capacitance detection circuit 100 is applied to touch detection, the base capacitance $C_0$ may be considered as a capacitance of the capacitor to be detected 111 to the ground when there is no touch. When there is a touch, the capacitance of the capacitor to be detected 111 is increased by $\Delta C$ relative to the base capacitance $C_0$, and $\Delta C$ reflects touch information of the user.

Manner 2

The first charging and discharging circuit 110 includes a first resistor 113, and the second charging and discharging circuit 120 includes a second resistor 123.

Optionally, the first resistor 113 is configured to charge the capacitor to be detected 111, and the second resistor 123 is configured to charge the calibration capacitor 121.

For example, a first end of the first resistor 113 is connected to a power supply $V_{DD}$, and a second end of the first resistor 113 is connected to a first end of the capacitor to be detected 111 through a first switch S1, the first end of the capacitor to be detected 111 is also grounded through a second switch S2, and a second end of the capacitor to be detected 111 is grounded; and a first end of the second resistor 123 is connected to the power supply $V_{DD}$, and a second end of the second resistor 123 is connected to a first end of the calibration capacitor 121 through a third switch S3, the first end of the calibration capacitor 121 is also grounded through a fourth switch S4, and a second end of the calibration capacitor 121 is grounded.

For another example, a first end of the first resistor 113 is grounded, and a second end of the first resistor 113 is connected to a first end of the capacitor to be detected 111 through a first switch S1, the first end of the capacitor to be detected 111 is also connected to a power supply $V_{DD}$ through a second switch S2, and a second end of the capacitor to be detected 111 is connected to the power supply; and a first end of the second resistor 123 is grounded, and a second end of the second resistor 123 is connected to a first end of the calibration capacitor 121 through a third switch S3, the first end of the calibration capacitor 121 is also connected to the power supply $V_{DD}$ through a fourth switch S4, and a second end of the calibration capacitor 121 is connected to the power supply.

Manner 3

The first charging and discharging circuit 110 includes a first transistor 114, and the second charging and discharging circuit 120 includes a second transistor 124.

The first transistor 114 and the second transistor 124 may be, for example, an N-type metal-oxide semiconductor (MOS) transistor or a P-type MOS transistor.

Optionally, the first transistor 114 is configured to charge the capacitor to be detected 111, and the second transistor 124 is configured to charge the calibration capacitor 121.

For example, a gate (Gate, G for short) of the first transistor 114 is connected to a level $V_{bn}$, and the level $V_{bn}$ makes the first transistor 114 work in a saturation region, a source (Source, S for short) of the first transistor 114 is connected to a power supply $V_{DD}$, and a drain (Drain, D for short) of the first transistor 114 is connected to a first end of the capacitor to be detected 111 through a first switch S1, the first end of the capacitor to be detected 111 is also grounded through a second switch S2, and a second end of the capacitor to be detected 111 is grounded; and a gate G of the second transistor 124 is connected to a level $V_{bn}$, and the level $V_{bn}$ makes the second transistor 124 work in a saturation region, a source S of the second transistor 124 is connected to a power supply $V_{DD}$, a drain D of the second transistor 124 is connected to a first end of the calibration capacitor 121 through a third switch S3, the first end of the calibration capacitor 121 is also grounded through a fourth switch S4, and a second end of the calibration capacitor 121 is grounded.

For another example, a gate G of the first transistor 114 is connected to a fixed level $V_{bn}$, and the level $V_{bn}$ makes the first transistor 114 work in a saturation region, a source S of the first transistor 114 is grounded, a drain D of the first transistor 114 is connected to a first end of the capacitor to be detected 111 through a first switch S1, the first end of the capacitor to be detected 111 is also connected to a power supply $V_{DD}$ through a second switch S2, and a second end of the capacitor to be detected 111 is connected to the power supply $V_{DD}$; and a gate G of the second transistor 124 is connected to a fixed level $V_{bn}$, and the level $V_{bn}$ makes the second transistor 124 work in a saturation region, a source S of the second transistor 124 is grounded, a drain D of the second transistor 124 is connected to a first end of the calibration capacitor 121 through a third switch S3, the first end of the calibration capacitor 121 is also connected to a power supply $V_{DD}$ through a fourth switch S4, and a second end of the calibration capacitor 121 is connected to the power supply $V_{DD}$.

In one implementation manner, the capacitance detection circuit 100 further includes a control circuit configured to control the foregoing switches and related circuits to perform corresponding operations.

For example, in a charging phase, the control circuit controls the second switch S2 and the fourth switch S4 to be turned off, and controls the first switch S1 and the third switch S3 to be turned on, so that the first charging and discharging circuit 110 and the second charging and discharging circuit 120 respectively charge the capacitor to be detected 111 and the calibration capacitor 121 simultaneously. In a discharging phase, the control circuit controls the first switch S1 and the third switch S3 to be turned off, and controls the second switch S2 and the fourth switch S4 to be turned on, so that the capacitor to be detected 111 and the calibration capacitor 121 are discharged simultaneously.

In one implementation manner, the capacitance detection circuit 100 further includes an operational amplifier 150, where two input ends of the operational amplifier 150 are respectively connected to the capacitor to be detected 111 and the calibration capacitor 121.

Figure 2:
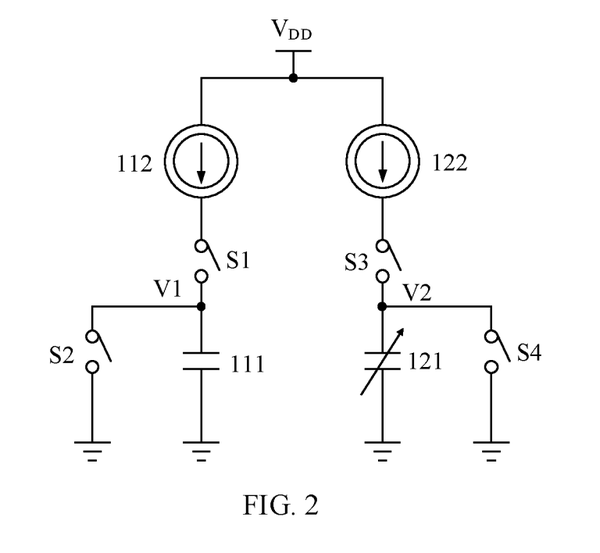
FIG. 2 is a possible schematic structural diagram of the capacitance detection circuit shown in FIG. 1.
Figure 3:
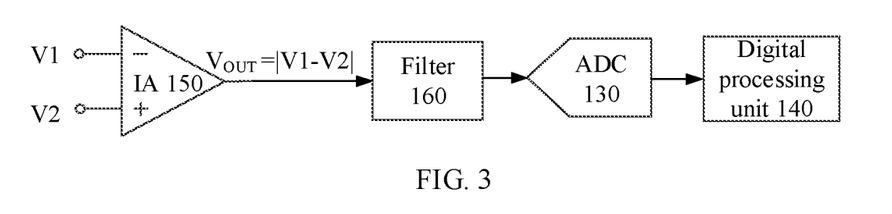
FIG. 3 is a possible schematic structural diagram of the capacitance detection circuit shown in FIG. 1.

For example, one input end of an IA 150 in FIG. 3 may be connected to the first end of the capacitor to be detected 111 in FIG. 2, and the other input end of the IA 150 is connected to the first end of the calibration capacitor 121 in FIG. 2. Since a digital processing unit 140 needs to sample a continuous voltage signal, preferably, the operational amplifier 150 is a continuous operational amplifier, such as an instrumentation operational amplifier (IA or INA), so as to amplify the continuous voltage signal.

In one implementation manner, the capacitance detection circuit 100 further includes a filter 160. An input end of the filter 160 is connected to an output end of the operational amplifier 150, and an output end of the filter 160 is connected to an input end of an analog-to-digital conversion circuit 130.

The filter 160 may be, for example, an anti-aliasing filter configured to reduce an aliasing frequency component in an output level.

Hereinafter, by taking a first current source 112 and a second current source 122 as an example, a working process of a capacitance detection circuit 100 of the present application will be described in detail with reference to FIGS. 2 to 4.

Figure 4:
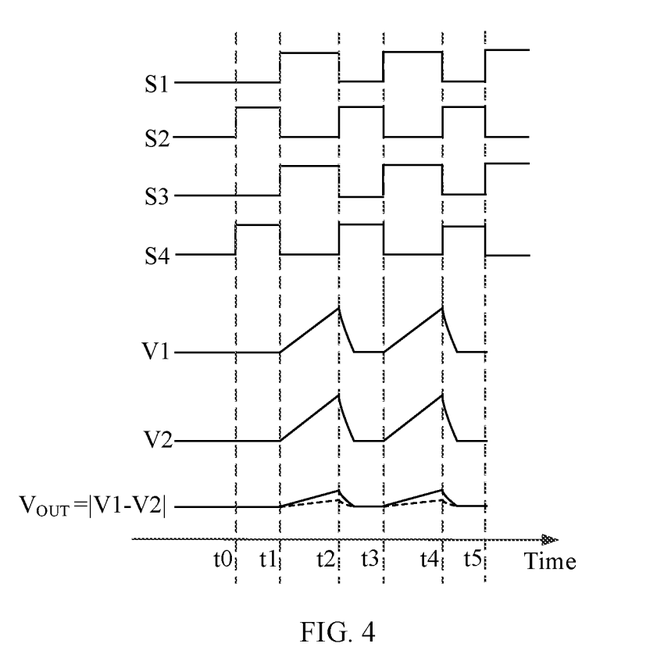
FIG. 4 is a timing diagram corresponding to the capacitance detection circuit shown in FIG. 2.

It should be understood that examples shown in FIGS. 2 to 4 are intended to help a person skilled in the art to better understand embodiments of the present application, and are not intended to limit the scope of the embodiments of the present application. Various equivalent modifications or variations based on FIGS. 2 to 4 also fall within the scope of the embodiments of the present application.

As shown in FIG. 2, the capacitance detection circuit 100 includes a first charging and discharging circuit 110, and the first charging and discharging circuit 110 includes a first current source 112, a first switch S1 and a second switch S2. A first end of the first current source 112 is connected to a power supply $V_{DD}$, a second end of the current source 112 is connected to a first end of a capacitor to be detected 111 through S1, a second end of the capacitor to be detected 111 is grounded, and the first end of the capacitor to be detected 111 is also grounded through S2. S1 is configured to control a process in which the first current source 112 charges the capacitor to be detected 111, and S2 is configured to control a process in which the capacitor to be detected 111 discharges to the ground.

The capacitance detection circuit 100 further includes a second charging and discharging circuit 120, and the second charging and discharging circuit 120 includes a second current source 122, a third switch S3 and a fourth switch S4. A first end of the second current source 122 is connected to a power supply $V_{DD}$, a second end of the second current source 122 is connected to a first end of a calibration capacitor 121 through S3, a second end of the calibration capacitor 121 is grounded, and the first end of the calibration capacitor 121 is also grounded through S4. S3 is configured to control a process in which the first current source 112 charges the calibration capacitor 121, and S4 is configured to control a process in which the calibration capacitor 121 discharges to the ground.

The first current source 112 and the second current source 122 may be proportional current sources, and a ratio between a current value $I_1$ of the first current source 112 and a current value $I_2$ of the second current source 122 may be fixed or adjustable.

According to a timing diagram shown in FIG. 4, in an initialization phase (a time period t0-t1), S2 and S4 are turned on, and S1 and S3 are turned off, so that the capacitor to be detected 111 and the calibration capacitor 121 are discharged, for example, completely discharged or discharged to a certain extent. At time t1, the quantity of charges stored in the capacitor to be detected 111 and the calibration capacitor 121 are both 0, a voltage V1 of the capacitor to be detected 111 is equal to 0, a voltage V2 of the calibration capacitor 121 is equal to 0, and a voltage difference between them is 0.

In a charging phase (a time period t1-t2), S1 and S3 are turned on, and S2 and S4 are turned off, so that the first current source 112 charges the capacitor to be detected 111, for example, fully charged or charged to a certain extent, and the second current source 122 charges the calibration capacitor 121, for example, fully charged or charged to a certain extent. FIG. 4 shows a changing rule of the voltage V1 of the capacitor to be detected 111 and a changing rule of the voltage V2 of the calibration capacitor 121 in the charging phase.

In a discharging phase (a time period t2-t4), S2 and S4 are turned on, and S1 and S3 are turned off, so that the capacitor to be detected 111 and the calibration capacitor 121 are discharged, for example, completely discharged or discharged to a certain extent. FIG. 4 shows a changing rule of the voltage V1 of the capacitor to be detected 111 and a changing rule of the voltage V2 of the calibration capacitor 121 in the discharging phase.

A ratio between a current value $I_1$ of the first current source 112 and a current value $I_2$ of the second current source 122, and a capacitance $C_C$ of the calibration capacitor 121 are adjusted so that $C_C \approx C_X \times I_2/I_1$, where $C_X$ is a capacitance of the capacitor to be detected 111. At this time, if there is no touch, that is, the capacitance value $C_X$ of the capacitor to be detected 111 is approximately equal to $C_0$, i.e., $C_X \approx C_0$, then $V1 \approx V2$, and a voltage difference between V1 and V2 is always close to 0, as shown by the dotted line corresponding to $V_{OUT}$ in FIG. 4. When there is a touch, the capacitance $C_X$ of the capacitor to be detected 111 is approximately equal to $C_0 + \Delta C$, i.e., $C_X \approx C_0 + \Delta C$, and an increasing rate of V1 in the charging process decreases, then V1<V2 in the charging phase, therefore the voltage difference between V1 and V2 also increases, and a changing rule of the voltage difference is shown by the solid line corresponding to $V_{OUT}$ in FIG. 4.

In an ideal case, $C_C = C_0 \times I_2/I_1$, and at this time, the voltage difference between V1 and V2 reflects the change of $\Delta C$ and is independent of $C_0$, and therefore the base capacitance $C_0$ is cancelled in a voltage domain, so that the capacitance detection circuit 100 is no longer affected by the base capacitance $C_0$, and the detection sensitivity and accuracy of the capacitance detection circuit 100 are improved. At this time, the dotted line corresponding to $V_{OUT}$ in FIG. 4 remains at 0.

In a practical application, since $C_C$ may not be strictly equal to $C_0 \times I_2/I_1$, the values of $C_C$ and $I_2/I_1$ may be set, so that the energy value of the fundamental frequency of the voltage difference between the capacitor to be detected 111 and the calibration capacitor 121 is as small as possible, for example, less than a predetermined value, when no touch occurs. At this time, the energy value of the fundamental frequency when no touch occurs may be denoted as A1, which may be used as a reference for determining whether the energy value changes in the subsequent.

In other words, the value of $C_C$ may be set, so that the difference value between $C_C$ and $C_0 \times I_2/I_1$ is less than a preset value, that is, it is considered that the detection requirement may be satisfied.

A time period t1-t3 is a charging and discharging period, and when the capacitance detection is performed once, data in one or more charging and discharging periods may be collected, that is, corresponding operations in the time period t1-t3 may be performed one or more times, and the capacitance variation of the capacitor to be detected 111 may be detected according to the change of the difference value between the voltage signal between the capacitor to be detected 111 and the calibration capacitor 121 in these charging and discharging periods. When data in a plurality of charging and discharging periods are collected each time, the solid line corresponding to $V_{OUT}$ in the last row in FIG. 4 may be approximately regarded as a periodic triangular wave. The periodic triangular wave signal is continuously sampled, and the energy value of the fundamental frequency of the difference value between the voltage signals of the capacitor to be detected 111 and the calibration capacitor 121 may be obtained according to the sampled data.

As shown in FIG. 3, the capacitance detection circuit 100 further includes an instrumentation operational amplifier IA 150, a filter 160, an analog-to-digital conversion circuit 130 and a digital processing circuit 140. Two input ends of IA 150 respectively receive voltage signals of the capacitor to be detected 111 and the calibration capacitor 121, and amplify and output a difference value between the voltage signals of the capacitor to be detected 111 and the calibration capacitor 121, where the output signal $V_{OUT}$ is equal to |V1−V2|, i.e., $V_{OUT}$=|V1−V2|.

Within N charging and discharging period(s), after V1 and V2 are input to IA 150, $V_{OUT}$ is output by IA 150 to the filter 160 for filtering, and the filtered voltage signal $V_{OUT}$ is input to ADC 130. The ADC 130 continuously samples the voltage signal $V_{OUT}$, that is, continuously samples the periodic triangular wave curve in FIG. 4.

A sampled frequency of ADC 130 shall not be too small, and preferably, the sampled frequency thereof may be greater than or equal to twice the signal bandwidth.

For example, a sampled interval is $T_S$, that is, the ADC 130 samples a point every $T_S$. A length of the N charging and discharging period(s) is $T_C$, the number of sampled points in $T_C$ is $2^M$, M is a positive integer, and $T_C = 2^M \times T_S$.

Voltage data of the $2^M$ sampled points sampled by the ADC 130 is transmitted to the digital processing circuit 140, and the digital processing circuit 140 processes these sampled points to obtain the energy value of the fundamental frequency of the sampled data of the periodic triangular wave curve in FIG. 4.

The fundamental frequency is, for example, $1/T_C$, and the energy value may be understood as a magnitude of signal amplitude of the fundamental frequency. That is, the digital processing circuit 140 determines the magnitude of the amplitude at the $1/T_C$ frequency point in a frequency spectrum according to the data collected by the analog-to-digital conversion circuit 130, thereby determining the capacitance of the capacitor to be detected 111.

In an embodiment of the present application, the voltage signal is digitally demodulated after analog-to-digital conversion is performed, so as to detect the capacitance variation of the capacitor to be detected in a digital domain. Since the interference signal and the useful signal have different frequencies, detecting the capacitance variation of the capacitor to be detected in the digital domain could reduce the noise interference, improve the signal-to-noise ratio of the capacitance detection circuit and improve the detection performance of the capacitance detection circuit.

It should be understood that the embodiment of the present application does not limit the structure of the data processing circuit, as long as the energy value of the fundamental frequency of the sampled signal can be obtained.

Optionally, the data processing circuit 140 may include a digital demodulator.

For example, the digital demodulator may perform digital quadrature demodulation on the sampled data to obtain the energy value of the fundamental frequency.

For another example, the digital demodulator may perform Fast Fourier Transform (FFT) on the sampled data to obtain a spectrogram, and obtain the energy value of the fundamental frequency according to the spectrogram.

In addition, the digital demodulator may also obtain the energy value of the fundamental frequency in other ways, which is not limited here.

The digital processing unit 140 determines the variation of the capacitance $C_X$ of the capacitor to be detected 111 according to the energy value of the fundamental frequency of the voltage difference between the capacitor to be detected 111 and the calibration capacitor 112 in the charging or discharging process. For example, when an energy value A2 of the fundamental frequency of the voltage difference is less than a preset threshold value, it may be considered that the capacitance $C_X$ has not changed, and at this time, a differential output $V_{OUT}$ of IA 150 is equal to |V1−V2|, which is very small, $C_C \approx C_X \times I_2/I_1$, and V2≈V1. When the energy value A2 of the fundamental frequency of the voltage difference is greater than or equal to the threshold value, it may be considered that the capacitance $C_X$ has changed, and at this time, the differential output $V_{OUT}$ of IA 150 is equal to |V1−V2|, which is larger, and $C_C < C_X \times I_2/I_1$, V2>V1.

If the energy value of the fundamental frequency is A1 when there is no touch and the energy value of the fundamental frequency is A2 when there is a touch, it may be determined whether the capacitance $C_X$ changes according to a value of A2−A1. For example, if it is applied to touch detection, when A2−A1 is less than a preset threshold value, it may be considered that no touch has occurred; and when A2−A1 is greater than or equal to the preset threshold value, it may be considered that there is finger touch. The operation of touching here may be understood as operation such as contacting, approaching, pressing, or the like.

Figure 5:
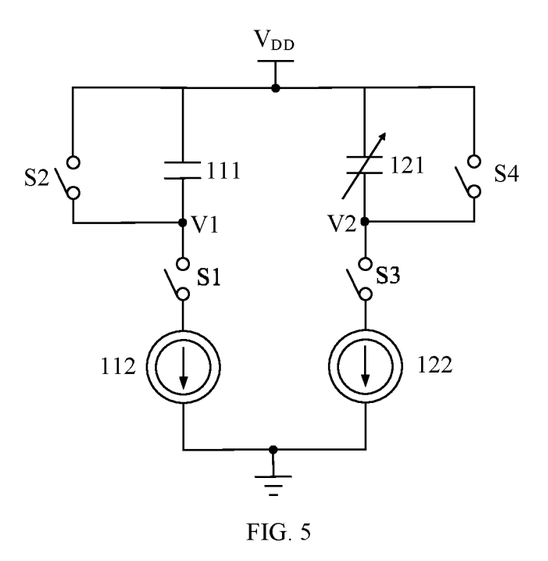
FIG. 5 is another possible schematic structural diagram of the capacitance detection circuit shown in FIG. 1.

The capacitor to be detected 111 and the calibration capacitor 121 in FIG. 2 may also be discharged by a power supply, and the capacitor to be detected 111 and the calibration capacitor 121 are driven by the first current source 112 and the second current source 122 to charge. For example, as shown in FIG. 5, one end of the capacitor to be detected 111 and the calibration capacitor 121 is connected to a power supply, and the other end thereof is connected to a current source, and the other end of the current source is grounded. At this time, in a time period t0-t1, S2 and S4 are turned on, S1 and S3 are turned off, and the capacitor to be detected 111 and the calibration capacitor 121 are discharged. In a time period t1-t2, S1 and S3 are turned on, S2 and S4 are turned off, and the capacitor to be detected 111 and the calibration capacitor 121 are driven by the first current source 112 and the second current source 122 to charge. In a time period t2-t3, S2 and S4 are turned on, S1 and S3 are turned off, and the capacitor to be detected 111 and the calibration capacitor 121 are discharged. In this way, the capacitance detection of the capacitor to be detected 111 may also be realized.

It should be understood that, expect that the current sources are used to drive charging or discharging of the capacitor to be detected 111 and the calibration capacitor 121, other devices such as a voltage source, may also be used to perform charging or discharging on the capacitor to be detected 111 and the calibration capacitor 121. In addition, the first charging and discharging circuit 110 and the second charging and discharging circuit 120 may adopt the same or different types of devices to perform charging or discharging on the capacitor to be detected 111 and the calibration capacitor 121, which is not limited in the present application. For example, the first current source 112 shown in FIG. 2 may be replaced by a first resistor 113 or a first transistor 113, and the second current source 122 may be replaced by a second resistor 123 or a second transistor 124. After replacement, the corresponding technical features may be referred to the foregoing description about FIGS. 2 to 4, which is not repeatedly described here for brevity.

Figure 6:
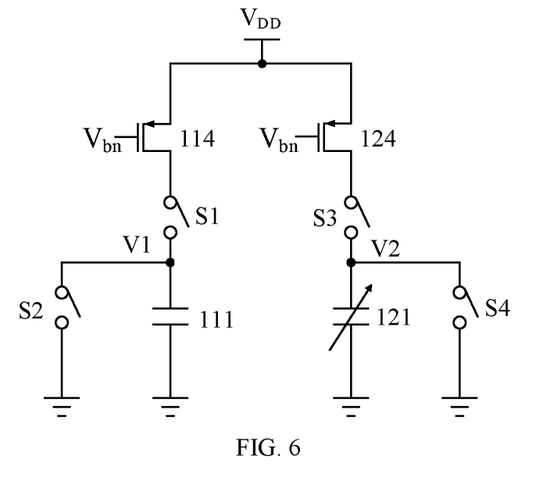
FIG. 6 is another possible schematic structural diagram of the capacitance detection circuit shown in FIG. 1.

For example, taking FIG. 6 as an example, in a time period t1-t2, the first transistor 114 and the second transistor 124 charge the capacitor to be detected 111 and the calibration capacitor 121, respectively, while in a time period t2-t3, the capacitor to be detected 111 and the calibration capacitor 121 are discharged to the ground, thereby realizing the capacitance detection of the capacitor to be detected 111.

Figure 7:
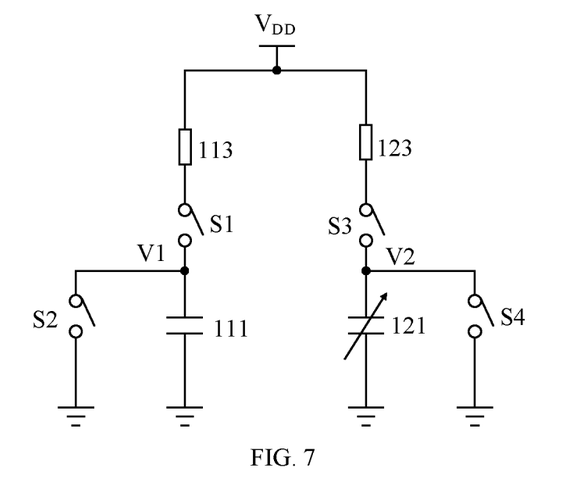
FIG. 7 is another possible schematic structural diagram of the capacitance detection circuit shown in FIG. 1.

For example, as shown in FIG. 7, in a time period t1-t2, the first resistor 113 and the second resistor 123 charge the capacitor to be detected 111 and the calibration capacitor 121, respectively, while in a time period t2-t3, the capacitor to be detected 111 and the calibration capacitor 121 are discharged to the ground, thereby realizing the capacitance detection of the capacitor to be detected 111.

The capacitance detection circuit 100 of an embodiment of the present application may be applied to various touch control devices. For example, the capacitor to be detected 111 may be a capacitive sensor disposed on a touch control panel, and the capacitive sensor is configured to detect touch information of a finger on the touch control panel, such as touch position, touch pressure and other information.

Figure 8:
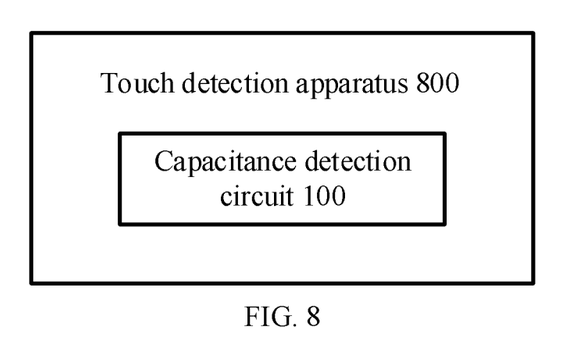
FIG. 8 is a schematic block diagram of a touch detection apparatus 800 according to an embodiment of the present application.

FIG. 8 is a schematic block diagram of a touch detection apparatus 800 according to an embodiment of the present application. As shown in FIG. 8, the touch detection apparatus 800 may include the capacitance detection circuit 100 shown in FIG. 1. The touch detection apparatus 800 may further determine touch information of a user according to the capacitance of the capacitor to be detected 111 determined by the capacitance detection circuit 100. Specifically, the touch detection apparatus 800 determines the touch information of the user according to a capacitance variation ΔC of the capacitor to be detected 111 determined by the capacitance detection circuit 100 relative to a base capacitance $C_0$.

Figure 9:
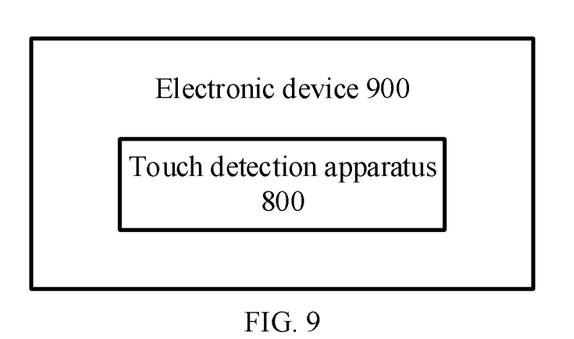
FIG. 9 is a schematic block diagram of an electronic device 900 according to an embodiment of the present application.

An embodiment of the present application also provides an electronic device 900, and as shown in FIG. 9, the electronic device 900 includes the touch detection apparatus 800 shown in FIG. 8.

By way of example but not limitation, the electronic device in the embodiment of the present application may be portable or mobile computing devices such as a terminal device, a mobile phone, a tablet computer, a notebook computer, a desktop computer, a gaming device, an in-vehicle electronic device or a wearable smart device, and other electronic devices such as an electronic database, an automobile and an automated teller machine (ATM). The wearable intelligent device includes a device, such as a smart watch or smart glasses, that is of a full function and a large size and that can implement all or some functions without relying on a smartphone, and a device, such as a smart band or smart jewelry that performs sign monitoring, that is dedicated to only one type of application function and that needs to be used together with another device such as a smartphone.

It shall be noted that each embodiment described in the present application and/or the technical features in each embodiment can be combined with each other arbitrarily in the case of no conflict, and the technical solutions obtained after combination should also fall into the protection scope of the present application.

It should be understood that the specific examples in the embodiments of the present application are only to help a person skilled in the art to better understand the embodiments of the present application, but not to limit the scope of the embodiments of the present application. Various modifications and variations which fall within the scope of the present application can be made by those skilled in the art based on the foregoing embodiments.

The foregoing descriptions are merely specific implementation manners of the present application. However, the protection scope of the present application is not limited thereto, and a person skilled in the art who is familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A capacitance detection circuit, comprising:
   a first charging and discharging circuit, configured to perform charging or discharging on a capacitor to be detected;
   a second charging and discharging circuit, configured to perform charging or discharging on a calibration capacitor;
   an analog-to-digital conversion circuit, configured to continuously sample a voltage difference between the capacitor to be detected and the calibration capacitor in a charging or discharging process to obtain sampled data; and a digital processing circuit, configured to detect a capacitance of the capacitor to be detected according to the sampled data;

wherein each charging and discharging period comprises a charging phase and a discharging phase, in the charging phase, the first charging and discharging circuit and the second charging and discharging circuit are respectively configured to simultaneously charge the capacitor to be detected and the calibration capacitor; and in the discharging phase, the capacitor to be detected and the calibration capacitor are discharged simultaneously.

2. The capacitance detection circuit according to claim 1, wherein the digital processing circuit is configured to detect the capacitance of the capacitor to be detected according to an energy value of a fundamental frequency of the sampled data.

3. The capacitance detection circuit according to claim 2, wherein the digital processing circuit comprises a digital demodulator, wherein the digital demodulator is configured to perform digital quadrature demodulation or Fourier transform on the sampled data to obtain the energy value of the fundamental frequency.

4. The capacitance detection circuit according to claim 2, wherein $T_C=2^M \times T_S$, wherein $T_C$ is a length of N charging and discharging period(s), $2^M$ is the number of sampled points in the N charging and discharging period(s), $T_S$ is a time interval between two adjacent sampled points, the fundamental frequency is $1/T_C$ and M and N are positive integers.

5. The capacitance detection circuit according to claim 1, wherein:

the first charging and discharging circuit comprises a first current source configured to perform charging or discharging on the capacitor to be detected; and the second charging and discharging circuit comprises a second current source configured to perform charging or discharging on the calibration capacitor.

6. The capacitance detection circuit according to claim 5, wherein a first end of the first current source is connected to a power supply, a second end of the first current source is connected to a first end of the capacitor to be detected through a first switch, the first end of the capacitor to be detected is also grounded through a second switch, and a second end of the capacitor to be detected is grounded; and a first end of the second current source is connected to the power supply, a second end of the second current source is connected to a first end of the calibration capacitor through a third switch, the first end of the calibration capacitor is also grounded through a fourth switch, and a second end of the calibration capacitor is grounded;

wherein the capacitance detection circuit further comprises a control circuit, configured to: in the charging phase, control the first switch and the third switch to be turned on, and control the second switch and the fourth switch to be turned off; in the discharging phase, control the second switch and the fourth switch to be turned on, and control the first switch and the third switch to be turned off.

7. The capacitance detection circuit according to claim 5, wherein a first end of the first current source is grounded, a second end of the first current source is connected to a first end of the capacitor to be detected through a first switch, the first end of the capacitor to be detected is also connected to a power supply through a second switch, and a second end of the capacitor to be detected is connected to the power supply; and a first end of the second current source is grounded, and a second end of the second current source is connected to a first end of the calibration capacitor through a third switch, the first end of the calibration capacitor is also connected to the power supply through a fourth switch, and a second end of the calibration capacitor is connected to the power supply;

wherein the capacitance detection circuit further comprises a control circuit, configured to: in the charging phase, control the first switch and the third switch to be turned on, and control the second switch and the fourth switch to be turned off; in the discharging phase, control the second switch and the fourth switch to be turned on, and control the first switch and the third switch to be turned off.

8. The capacitance detection circuit according to claim 5, wherein $C_C$ is equal to $C_0 \times I_2/I_1$, or a difference value between $C_C$ and $C_0 \times I_2/I_1$ is less than a preset value, wherein $C_0$ is a base capacitance of the capacitor to be detected, $C_C$ is a capacitance of the calibration capacitor, $I_1$ is a current value of the first current source, and $I_2$ is a current value of the second current source.

9. The capacitance detection circuit according to claim 1, wherein the first charging and discharging circuit comprises a first resistor configured to perform charging or discharging on the capacitor to be detected; and the second charging and discharging circuit comprises a second resistor configured to perform charging or discharging on the calibration capacitor.

10. The capacitance detection circuit according to claim 9, wherein a first end of the first resistor is connected to a power supply, a second end of the first resistor is connected to a first end of the capacitor to be detected through a first switch, the first end of the capacitor to be detected is also grounded through a second switch, and a second end of the capacitor to be detected is grounded; and a first end of the second resistor is connected to the power supply, a second end of the second resistor is connected to a first end of the calibration capacitor through a third switch, the first end of the calibration capacitor is also grounded through a fourth switch, and a second end of the calibration capacitor is grounded;

wherein the capacitance detection circuit further comprises a control circuit, configured to: in the charging phase, control the first switch and the third switch to be turned on, and control the second switch and the fourth switch to be turned off; in the discharging phase, control the second switch and the fourth switch to be turned on, and control the first switch and the third switch to be turned off.

11. The capacitance detection circuit according to claim 9, wherein a first end of the first resistor is grounded, a second end of the first resistor is connected to a first end of the capacitor to be detected through a first switch, the first end of the capacitor to be detected is also connected to a power supply through a second switch, and a second end of the capacitor to be detected is connected to the power supply; and a first end of the second resistor is grounded, and a second end of the second resistor is connected to a first end of the calibration capacitor through a third switch, the first end of the calibration capacitor is also connected to the power supply through a fourth switch, and a second end of the calibration capacitor is connected to the power supply;

wherein the capacitance detection circuit further comprises a control circuit, configured to: in the charging phase, control the first switch and the third switch to be turned on, and control the second switch and the fourth switch to be turned off; in the discharging phase, control the second switch and the fourth switch to be turned on, and control the first switch and the third switch to be turned off.

12. The capacitance detection circuit according to claim 1, wherein
the first charging and discharging circuit comprises a first transistor configured to perform charging or discharging on the capacitor to be detected; and
the second charging and discharging circuit comprises a second transistor configured to perform charging or discharging on the calibration capacitor.

13. The capacitance detection circuit according to claim 12,
wherein a gate of the first transistor is connected to a fixed level, a source of the first transistor is connected to a power supply, a drain of the first transistor is connected to a first end of the capacitor to be detected through a first switch, the first end of the capacitor to be detected is also grounded through a second switch, and a second end of the capacitor to be detected is grounded; and
a gate of the second transistor is connected to a fixed level, a source of the second transistor is connected to the power supply, a drain of the second transistor is connected to a first end of the calibration capacitor through a third switch, the first end of the calibration capacitor is also grounded through a fourth switch, and a second end of the calibration capacitor is grounded;
wherein the capacitance detection circuit further comprises a control circuit, configured to: in the charging phase, control the first switch and the third switch to be turned on, and control the second switch and the fourth switch to be turned off; in the discharging phase, control the second switch and the fourth switch to be turned on, and control the first switch and the third switch to be turned off.

14. The capacitance detection circuit according to claim 12,
wherein a gate of the first transistor is connected to a fixed level, a source of the first transistor is grounded, a drain of the first transistor is connected to a first end of the capacitor to be detected through a first switch, the first end of the capacitor to be detected is connected to a power supply through a second switch, and a second end of the capacitor to be detected is connected to the power supply; and
a gate of the second transistor is connected to a fixed level, a source of the second transistor is grounded, a drain of the second transistor is connected to a first end of the calibration capacitor through a third switch, the first end of the calibration capacitor is also connected to the power supply through a fourth switch, and a second end of the calibration capacitor is connected to the power supply;

wherein the capacitance detection circuit further comprises a control circuit, configured to: in the charging phase, control the first switch and the third switch to be turned on, and control the second switch and the fourth switch to be turned off; in the discharging phase, control the second switch and the fourth switch to be turned on, and control the first switch and the third switch to be turned off.

15. The capacitance detection circuit according to claim 1, wherein the capacitance detection circuit further comprises a continuous instrumentation operational amplifier (IA) and a filter,
wherein two input ends of the operational amplifier are respectively connected to the capacitor to be detected and the calibration capacitor, an input end of the filter is connected to an output end of the operational amplifier, and an output end of the filter is connected to an input end of the analog-to-digital conversion circuit.

16. The capacitance detection circuit according to claim 1, wherein the capacitor to be detected is a capacitive sensor disposed on a touch control panel, and the capacitive sensor is configured to detect touch information of a finger on the touch control panel.

17. The capacitance detection circuit according to claim 16, wherein
when the energy value of a fundamental frequency of the sampled data is less than a threshold value, it indicates that no finger touches the capacitive sensor; and
when the energy value of the fundamental frequency is greater than the threshold value, it indicates that a finger touches the capacitive sensor.

18. A touch detection apparatus, comprising a capacitance detection circuit, wherein the capacitance detection circuit comprises:
a first charging and discharging circuit, configured to perform charging or discharging on a capacitor to be detected;
a second charging and discharging circuit, configured to perform charging or discharging on a calibration capacitor;
an analog-to-digital conversion circuit, configured to continuously sample a voltage difference between the capacitor to be detected and the calibration capacitor in a charging or discharging process to obtain sampled data; and
a digital processing circuit, configured to detect a capacitance of the capacitor to be detected according to the sampled data;
wherein each charging and discharging period comprises a charging phase and a discharging phase,
in the charging phase, the first charging and discharging circuit and the second charging and discharging circuit are respectively configured to simultaneously charge the capacitor to be detected and the calibration capacitor; and
in the discharging phase, the capacitor to be detected and the calibration capacitor are discharged simultaneously.

19. An electronic device comprising the touch detection apparatus according to claim 18.

* * * * *